US012670937B2

(12) United States Patent
Mayer et al.

(10) Patent No.: US 12,670,937 B2
(45) Date of Patent: Jun. 30, 2026

(54) MULTI-DRIVER SIGNALING

(71) Applicant: Micron Technology, Inc., Boise, ID (US)

(72) Inventors: Peter Mayer, Neubiberg (DE); Rethin Raj, Augsburg (DE); Nobuyuki Umeda, Tokyo (JP); Andreas Schneider, Gernlinden (DE); Casto Salobrena Garcia, Munich (DE)

(73) Assignee: Micron Technology, Inc., Boise, ID (US)

( * ) Notice: Subject to any disclaimer, the term of this patent is extended or adjusted under 35 U.S.C. 154(b) by 133 days.

(21) Appl. No.: 18/806,368

(22) Filed: Aug. 15, 2024

(65) Prior Publication Data

US 2024/0412765 A1     Dec. 12, 2024

Related U.S. Application Data

(63) Continuation of application No. 17/719,486, filed on Apr. 13, 2022, now Pat. No. 12,087,393.

(60) Provisional application No. 63/181,835, filed on Apr. 29, 2021.

(51) Int. Cl.
*G11C 7/10*     (2006.01)

(52) U.S. Cl.
CPC .......... *G11C 7/1084* (2013.01); *G11C 7/1057* (2013.01)

(58) Field of Classification Search
None
See application file for complete search history.

(56) References Cited

U.S. PATENT DOCUMENTS

| | | | |
|---|---|---|---|
| 10,686,634 B2 | 6/2020 | Hollis et al. | |
| 10,878,860 B1 * | 12/2020 | Gupta ................. | G06F 13/4086 |
| 2003/0206048 A1 | 11/2003 | Toyoshima et al. | |
| 2008/0291063 A1 | 11/2008 | Hollis | |
| 2009/0190421 A1 | 7/2009 | Park et al. | |
| 2015/0208027 A1 * | 7/2015 | Takai ....................... | H04N 5/46 |
| | | | 348/473 |
| 2016/0065211 A1 | 3/2016 | Hsu | |
| 2016/0182044 A1 | 6/2016 | Addepalli et al. | |

(Continued)

FOREIGN PATENT DOCUMENTS

KR     10-2022-0033397 A     3/2022

OTHER PUBLICATIONS

"International Search Report and Written Opinion of the International Searching Authority," issued in connection with Int'l Appl. No. PCT/US2022/071831, dated Aug. 1, 2022 (13 pages).

*Primary Examiner* — Anh Q Tran
(74) *Attorney, Agent, or Firm* — Holland & Hart LLP

(57)     ABSTRACT

Methods, systems, and devices for multi-driver signaling are described. An apparatus may include a first voltage source configured to supply a positive voltage and a second voltage source configured to supply a negative voltage. The apparatus may also include a first driver configured to couple a transmission line of a bus with the first voltage source and a second driver configured to couple the transmission line of the bus with the second voltage source. The first driver may be configured to transfer current to the transmission line based on a configurable resistance of the first driver. And the second driver configured to transfer current from the transmission line of the bus based on a configurable resistance of the second driver.

20 Claims, 6 Drawing Sheets

(56)         References Cited

U.S. PATENT DOCUMENTS

2019/0044769 A1     2/2019  Hollis
2019/0394071 A1    12/2019  Farzan et al.
2020/0293230 A1     9/2020  Spirkl et al.
2020/0382121 A1 *  12/2020  Jeong ................. H03K 19/0005
2021/0058280 A1     2/2021  Lee et al.

* cited by examiner

Eye Diagram 205

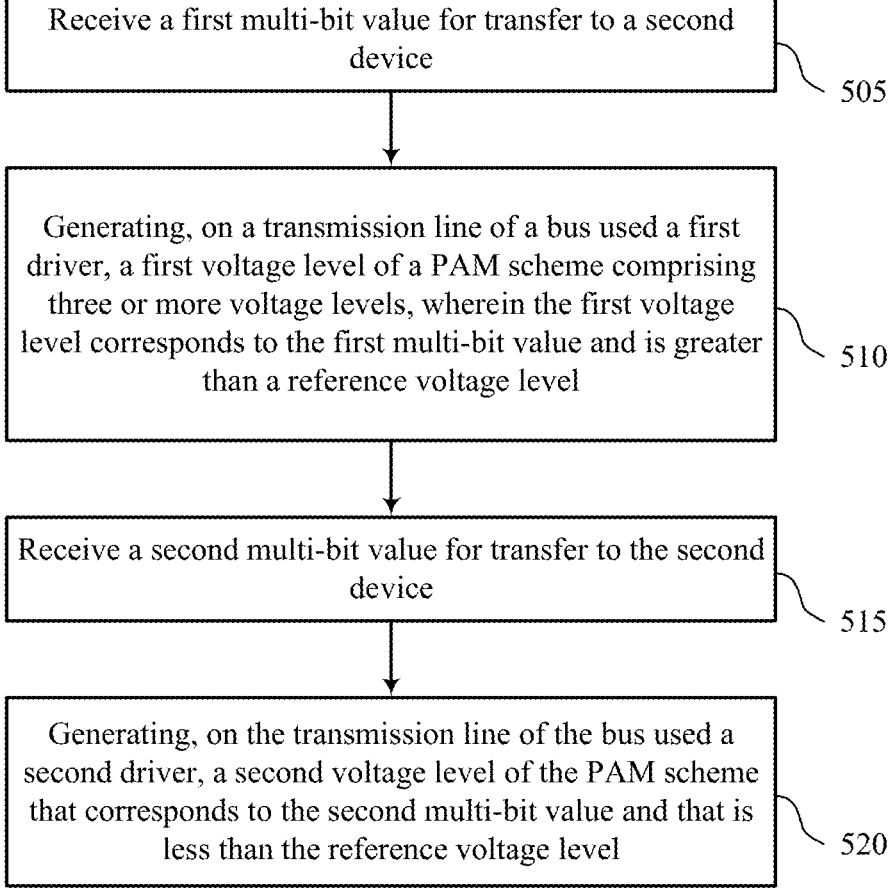

Receive a first multi-bit value for transfer to a second device

505

Generating, on a transmission line of a bus used a first driver, a first voltage level of a PAM scheme comprising three or more voltage levels, wherein the first voltage level corresponds to the first multi-bit value and is greater than a reference voltage level

510

Receive a second multi-bit value for transfer to the second device

515

Generating, on the transmission line of the bus used a second driver, a second voltage level of the PAM scheme that corresponds to the second multi-bit value and that is less than the reference voltage level

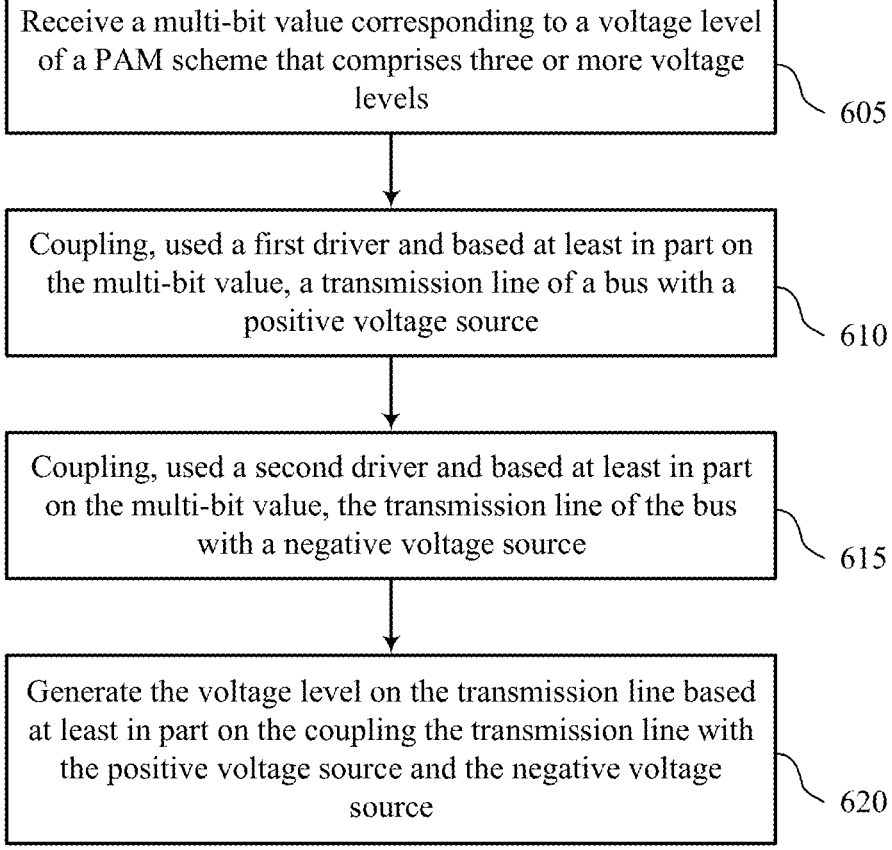

Receive a multi-bit value corresponding to a voltage level of a PAM scheme that comprises three or more voltage levels

605

Coupling, used a first driver and based at least in part on the multi-bit value, a transmission line of a bus with a positive voltage source

610

Coupling, used a second driver and based at least in part on the multi-bit value, the transmission line of the bus with a negative voltage source

615

Generate the voltage level on the transmission line based at least in part on the coupling the transmission line with the positive voltage source and the negative voltage source

MULTI-DRIVER SIGNALING

CROSS REFERENCE

The present Application for Patent is a continuation of U.S. patent application Ser. No. 17/719,486 by MAYER et al., entitled "MULTI-DRIVER SIGNALING," filed Apr. 13, 2022, which claims the benefit of U.S. Provisional Patent Application No. 63/181,835 by MAYER et al., entitled "MULTI-DRIVER SIGNALING," filed Apr. 29, 2021, each of which is assigned to the assignee hereof, and each of which is expressly incorporated by reference in its entirety herein.

FIELD OF TECHNOLOGY

The following relates generally to one or more systems for memory and more specifically to multi-driver signaling.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device. Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

BRIEF DESCRIPTION OF THE DRAWINGS

FIGS. 5 and 6 show flowcharts illustrating a method or methods that support multi-driver signaling in accordance with examples as disclosed herein.

DETAILED DESCRIPTION

Figure 1:
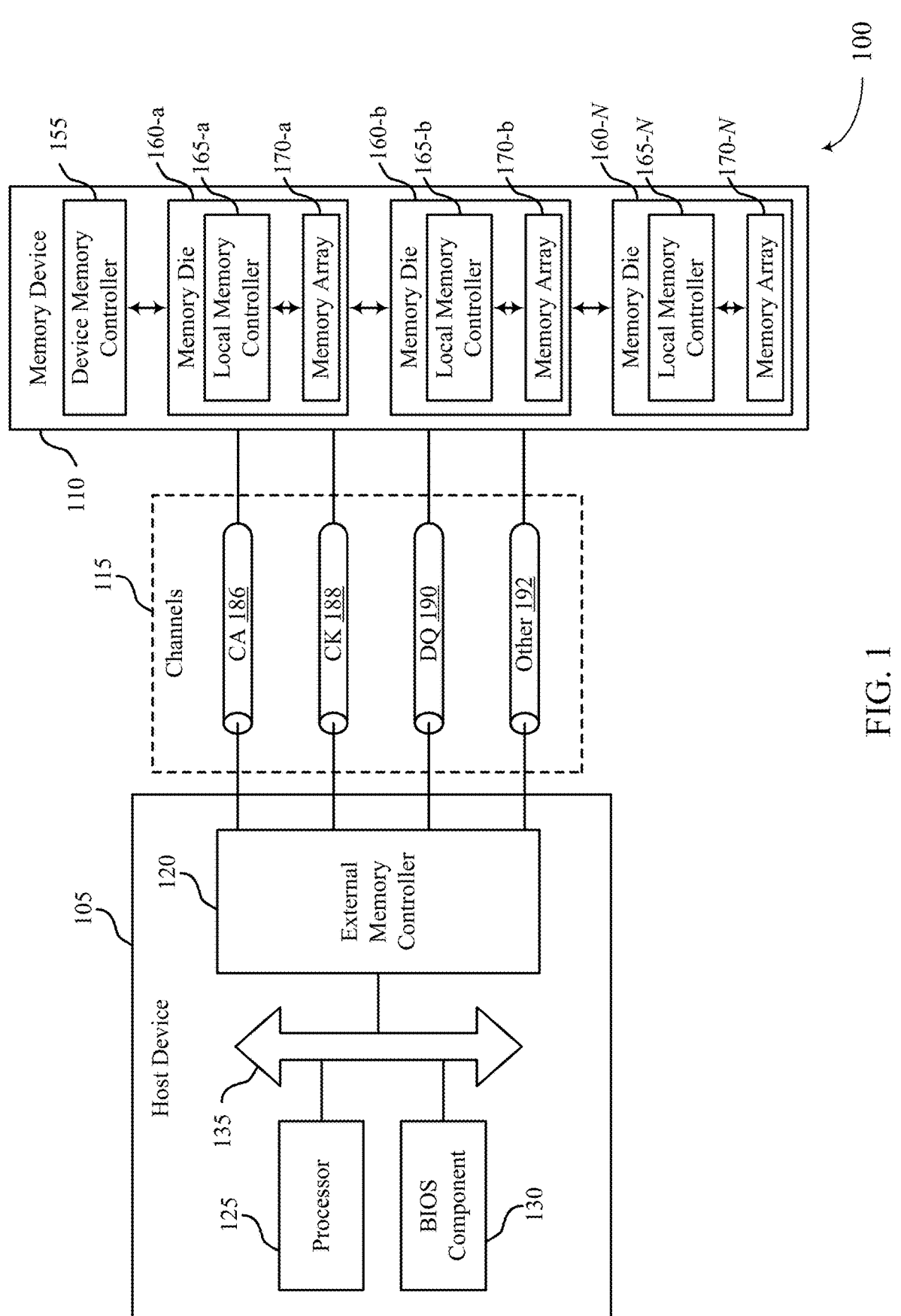
FIG. 1 illustrates an example of a system that supports multi-driver signaling in accordance with examples as disclosed herein.

A device, such as an electronic device, may include one or more drivers for communicating data signals over the transmission lines of a bus. For example, a device may include a pull-down driver that reduces the voltage on a transmission line of a bus by different amounts to represent different data symbols, such as pulse-amplitude-modulated (PAM) symbols. Alternatively, a device may include a pull-up driver that increases the voltage on a transmission line of a bus by different amounts to represent different data symbols. But operating a single driver (e.g., a pull-down driver or a pull-up driver) in a one direction to generate the various voltage levels of a PAM scheme may reduce communication speed, signal integrity, or both, among other disadvantages.

In contrast with other different apparatuses and techniques, according to the techniques described herein, a device may improve data signaling by operating multiple drivers in different directions to generate the various voltage levels of a modulation scheme, such as a PAM scheme. For example, the device may include 1) a pull-up driver that increases the voltage of a transmission line to represent data symbols with PAM voltage levels that are above the termination voltage of the bus, and 2) a pull-down driver that decreases the voltage of the transmission line to represent data symbols with PAM voltage levels that are below the termination voltage. By operating multiple drivers in different directions, the device may improve communication speed, signal integrity, or both, among other advantages.

In a first technique, which may be referred to as the ground termination technique, the device may terminate a transmission line of a bus via a resistor that is coupled with a ground reference. When the ground termination technique is used, the device may generate data symbols with PAM voltage levels above the termination voltage (e.g., 0 V) by activating the pull-up driver and deactivating the pull-down driver. The device may generate data symbols with PAM voltage levels below the termination voltage by activating the pull-down driver and deactivating the pull-up driver.

In a second technique, which may be referred to as the cross-current technique, the device may maintain (e.g., in between data symbols) the transmission line at or near zero volts by activating the pull-up driver and the pull-down driver so that the drivers effectively cancel each other out. When the cross-current technique is used, the device may generate data symbols with PAM voltage levels above the termination voltage (e.g., 0 V) by increasing the drive strength of the pull-up driver, decreasing the drive strength of the pull-down driver, or both. The device may generate data symbols with PAM voltage levels below the termination voltage by decreasing the drive strength of the pull-up driver, increasing the drive strength of the pull-down driver, or both.

Features of the disclosure are initially described in the context of a system as described with reference to FIG. 1. Features of the disclosure are described in the context of PAM voltage levels and a system as described with reference to FIGS. 2 and 3. These and other features of the disclosure are further illustrated by and described with reference to an apparatus diagram and flowcharts that relate to multi-driver signaling as described with reference to FIGS. 4-6.

FIG. 1 illustrates an example of a system 100 that supports multi-driver signaling in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 (e.g., memory die 160 *a*, memory die 160 *b*, memory die 160 N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

So, in some examples, a device may use a multi-level modulation scheme (e.g., a modulation scheme that includes at least three levels to encode more than one bit of information per modulation symbol) to a modulate a set of data for communication. As noted, a device may use a PAM scheme that uses different levels to represent different symbol values. Such levels may also be referred to herein as symbol levels, PAM voltage levels, or other suitable terminology. In some examples, the device may use a PAM4 scheme that has four symbol levels each associated with a respective symbol value that represents multiple (e.g., two) bits.

A device (e.g., a host device 105, a memory device 110) may communicate data to another device via one or more data buses, which may include aspects of the DQ channel(s) 190. A data bus may include one or more transmission lines and may be characterized by the voltage level at which the transmission lines are terminated (relative to the voltage levels of the data symbols). For example, a data bus may be referred to as a high level terminated data bus if the data bus is terminated by a high voltage level relative to the voltage levels of the data symbols. As another example, a data bus may be referred to as a low level terminated data bus if the data bus is terminated by a low voltage level relative to the voltage levels of the data symbols. So, in some examples the termination voltage of a data bus may refer to the voltage at which the data bus is maintained in between transmission of data symbols.

If a device incudes a high level terminated data bus, the device may use pull-down drivers to generate the voltage levels for data symbols. A pull-down driver may refer to a driver that is configured to decrease the voltage of the transmission line by sinking (e.g., drawing, transferring) current from the transmission line. If a device includes a low level terminated data bus, the device may use pull-up drivers to generate the voltage levels for data symbols. A pull-up driver may refer to a driver that is configured to increase the voltage of a transmission line by providing (e.g., transferring) current to the transmission line. Thus, in other different techniques or apparatuses, a device may generate the voltage levels for data symbols by operating a driver (e.g., a pull-up driver, a pull-down driver) in a single direction (e.g., by increasing the transmission line voltage by varying amounts or by decreasing the transmission line voltage by varying amounts). But a single driver, in other different techniques or apparatuses, may not be able to efficiently transition between voltage levels, which may reduce signal integrity and limit communication rates, among other disadvantages.

According to the techniques described herein, a device may improve data signaling by operating multiple drivers in different directions. For example, the device may use a pull-up driver in conjunction with a pull-down driver to generate the various voltage levels of a PAM scheme on a transmission line. The device may generate voltages above the termination level of the transmission line by activating (or increasing the drive strength of) the pull-up driver and deactivating (or reducing the drive strength of) the pull-down driver. And the device may generate voltages below the termination level of the transmission line by activating (or increasing the drive strength of) the pull-down driver and deactivating (or reducing the drive strength of) the pull-up driver. The drive strength of a driver may refer to the amount of current transferred by the driver, where an increase in drive strength refers to an increase in current transfer and a decrease in drive strength refers to a decrease in current transfer. The drive strength of a driver may vary with the configurable resistance of the driver. So, in some examples, the drive strength of a driver may be dynamically controlled by changing the configurable resistance of the driver.

The operation of the pull-up driver and the pull-down driver may vary depending on whether the transmission line is passively terminated, for example, via a resistor coupled with ground (or another reference voltage) or actively terminated, for example, by operating the drivers in equilibrium. For instance, if the transmission line is passively terminated (e.g., as in the ground termination technique), the device may generate data symbols with voltages above the termination voltage by activating the pull-up driver and deactivating the pull-down driver. Additionally or alternatively, the device may generate data symbols with voltage levels below the termination voltage by activating the pull-down driver and deactivating the pull-up driver. If the transmission line is actively terminated (e.g., as in the cross-current technique), the device may generate data symbols with voltages above the termination voltage by increasing the drive strength of the pull-up driver, partially or completely decreasing the drive strength of the pull-down driver, or both. Additionally or alternatively, the device may generate data symbols with voltages above the termination voltage by partially or completely decreasing the drive strength of the pull-up driver, increasing the drive strength of the pull-down driver, or both.

Although described with reference to data buses, the techniques described herein may be applied to other types of data buses, including command buses, addresses buses, command and address buses, and the like.

Figure 2:
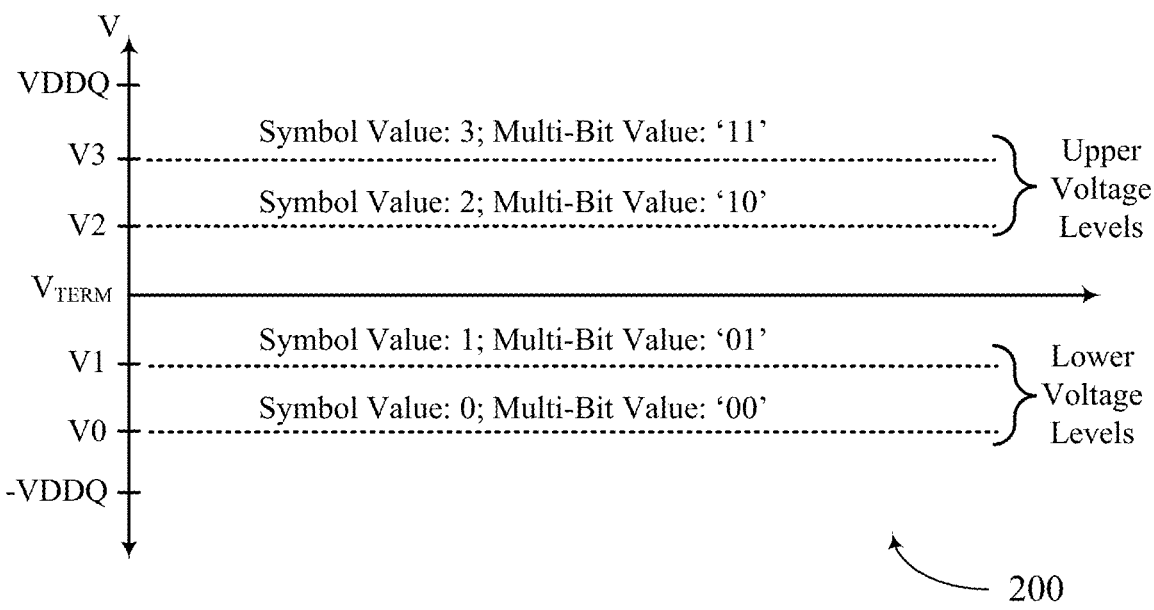
FIG. 2 illustrates an example of voltage levels and an eye diagram that support multi-driver signaling in accordance with examples as disclosed herein.
Figure 2:
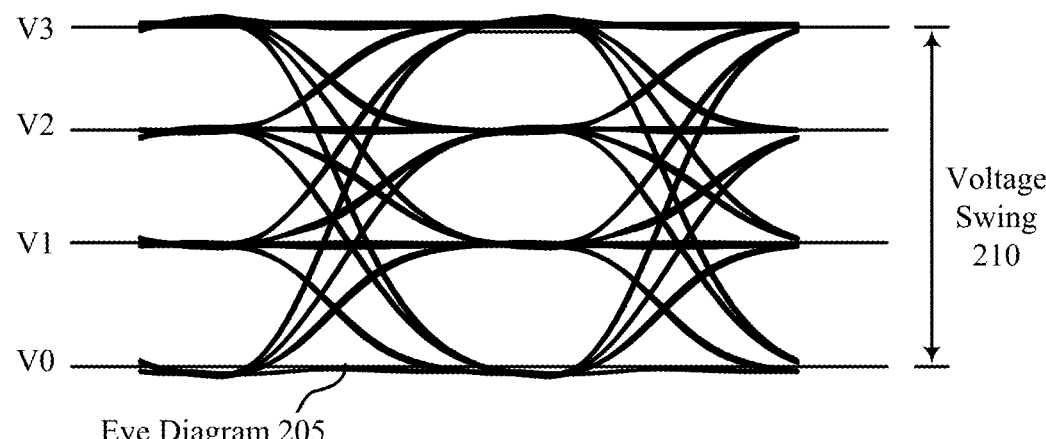

FIG. 2 illustrates an example of voltage levels 200 and an eye diagram 205 that support multi-driver signaling in accordance with examples as disclosed herein. The voltage levels 200 may be examples of PAM voltage levels, among other examples, such as PAM4 voltage levels. For example, the voltage levels 200 may include: a first voltage level (V0) corresponding to a first symbol value (0) that represents a first multi-bit value ('00'), a second voltage level (V1) corresponding to a second symbol value ('1) that represents a second multi-bit value ('01'), a third voltage level (V2) corresponding to a third symbol value (2) that represents a third multi-bit value ('10'), and a fourth voltage level (V3) corresponding to a fourth symbol value (3) that represents a fourth multi-bit value ('11'). Although FIG. 2 is described in the context of four multi-bit values having specific values, other examples and different distributions of multi-bit values and different quantities of multi-bit values are additionally and alternatively contemplated.

A device may generate the voltage levels 200 by operating multiple drivers in different directions as described herein. For example, the device may generate the upper voltage levels (corresponding to upper PAM symbols) by activating (or increasing the drive-strength of) a pull-up driver and deactivating (or reducing the drive strength of) a pull-down driver. The upper voltage levels may be the voltage levels above the termination voltage ($V_{TERM}$) of a transmission line or bus, which in some examples may be zero volts or close to zero volts. Thus, in FIG. 2, the upper voltage levels may be voltage levels V2 and V3. The device may generate the lower voltage levels (corresponding to lower PAM symbols) by deactivating (or reducing the drive strength of) the pull-up driver and activating (or increasing the drive strength of) the pull-down driver. The lower voltage levels may be the voltage levels below the termination voltage of the transmission line or bus. Thus, in FIG. 2 the lower voltage levels may be voltage levels V0 and V1. In some examples, V0 may be –0.4 V, V1 may be –0.2 V, $V_{TERM}$ may be 0 V, V2 may be +0.2 V, and V3 may be +0.4V. However, other values are contemplated and within the scope of this disclosure.

By operating multiple drivers in opposite directions to generate the voltage levels 200 for PAM symbols, a device may reduce (relative to other techniques) transition times between voltage levels as well as the voltage swing between the uppermost and lowermost voltage levels (e.g., V3 and V0), which in turn may improve the integrity of the data signal. For example, referring to eye diagram 205, which represents various transitions between the voltage levels V0 through V3, the voltage swing 210 may be reduced relative to other techniques.

Although described with reference to PAM4, the techniques described herein can be used for any type of PAM, including PAM2 (which may also be referred to as non-return to zero (NRZ). A PAM2 scheme may include two of the four voltage levels illustrated in FIG. 2 (e.g., voltage level V1 and voltage level V2). In some examples, the device may be a host device or a memory device.

Figure 3:
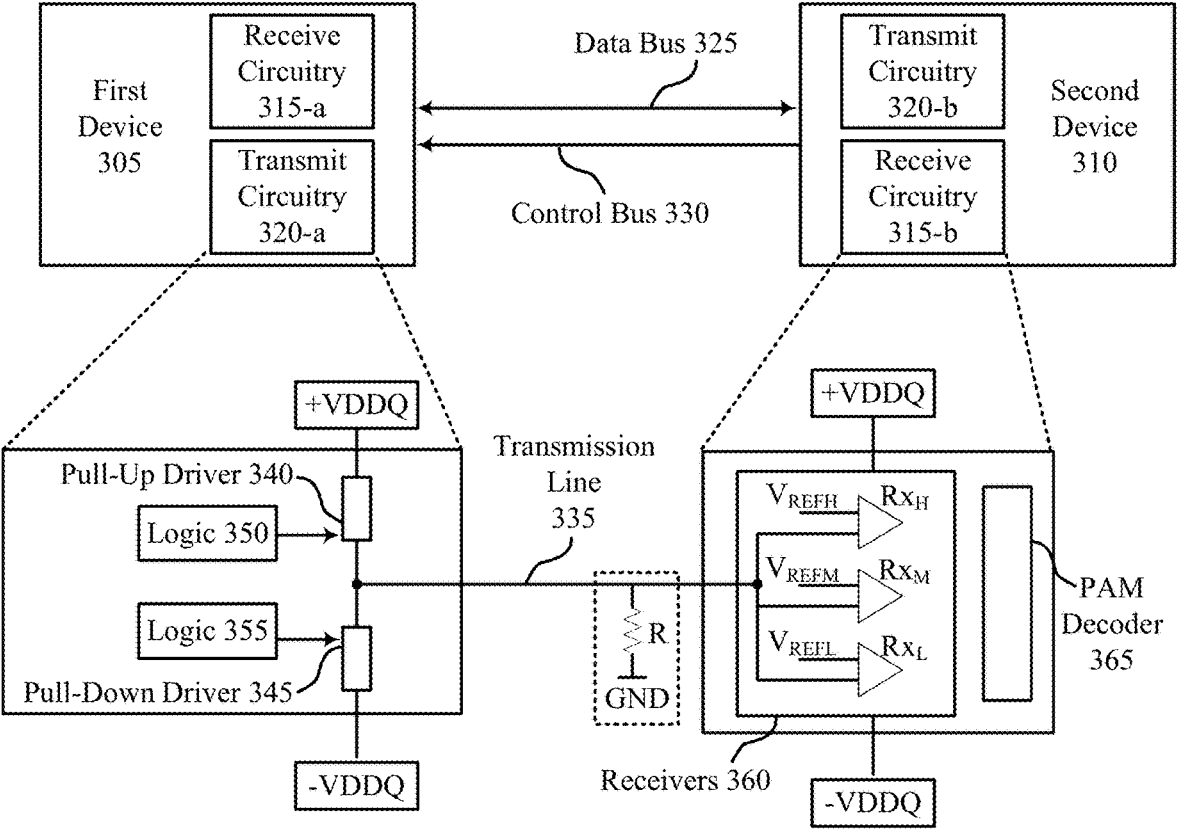
FIG. 3 illustrates an example of a system that supports multi-driver signaling in accordance with examples as disclosed herein.

FIG. 3 illustrates an example of a system 300 that supports multi-driver signaling in accordance with examples as disclosed herein. The system 300 may be an example of a system 100, as described with reference to FIG. 1; however, system 300 is not limited to the illustrative systems and devices described herein. The system 300 may include a first device 305 and a second device 310. In some examples, the first device 305 is a host device and the second device is a memory device. In some examples, the first device 305 is a memory device and the second device 310 is a host device. Each device may operate multiple drivers in opposite directions (e.g., a positive direction and a negative direction) to generate voltage levels for data symbols on a data bus.

The first device 305 and the second device 310 may each include receive circuitry 315 and transmit circuitry 320 (which may also be referred to as a multi-level interface). For example, the first device 305 may include receive circuitry 315-*a* and transmit circuitry 320-*a*; and the second device 310 may include receive circuitry 315-*b* and transmit circuitry 320-*b*. The receive circuitry 315-*a* may be similar to the receive circuitry 315-*b* and thus is not illustrated in detail. The transmit circuitry 320-*b* may be similar to the transmit circuitry 320-*a* and thus is not illustrated in detail.

The first device 305 and the second device 310 may use the transmit circuitry 320 and the receive circuitry 315 to communicate data signals (e.g., sequences or streams of PAM symbols) over the data bus 325. The first device 305 and the second device 310 may also use the transmit circuitry 320 and the receive circuitry 315 to communicate control signals over the control bus 330, which may in some examples be a command bus, an address bus, or both. The data signals communicated by the transmit circuitry 320 may be based on or correspond to multi-bit values received from a peripheral device or from a component (e.g., a data buffer) of the device that includes the transmit circuitry 320.

The data bus 325 may include one or more transmission lines, which may be conductive traces or activatable conductive paths. For example, the data bus 325 may include transmission line 335. The transmission line 335 may be coupled with a pair of drivers at the first device 305 and may be coupled with a set of receivers at the second device 310. In some examples, the data bus 325 may be a bi-directional bus which means that data may be communicated in both directions over the data bus 325 (e.g., data may be communicated from the first device 305 to the second device 310 and vice versa, albeit at different times). In such examples, the transmission line 335 may also be coupled with a pair of drivers at the second device 310 and a set of receivers at the first device 305. In other examples, the data bus 325 may be a unidirectional bus which means that data is communicated in a single direction over the data bus 325. In such examples, the transmit circuitry 320-*a* and the receive circuitry 315-*b* may be coupled with the data bus 325, and the transmit circuitry 320-*b* and the receive circuitry 315-*a* may be coupled with a different data bus than the data bus 325.

The first device 305 may generate PAM voltage levels on the transmission line 335 of the data bus 325 by using the pull-up driver 340 and the pull-down driver 345 in combination.

In the ground termination technique, the first device 305 may generate PAM voltage levels on the transmission line 335 by activating the pull-up driver 340 and the pull-down driver 345, for example, at different times. For example, the first device 305 may generate upper PAM symbols by activating the pull-up driver 340 and deactivating the pull-down driver 345. The pull-up driver 340 may be coupled with a positive voltage source (e.g., +VDDQ) that has a higher voltage potential than transmission line 335, so activation of the pull-up driver 340 may cause current to flow from the voltage source +VDDQ to the transmission line 335, which in turn may increase the voltage on the transmission line 335. The amount of current transferred by the pull-up driver 340 (and thus the voltage boost on the transmission line 335) may vary with the configurable resistance of the pull-up driver 340.

The first device 305 may generate lower PAM symbols by activating the pull-down driver 345 and deactivating the pull-up driver 340. The pull-down driver 345 may be coupled with a negative voltage source (e.g., –VDDQ) that has a lower voltage potential than the transmission line 335, so activation of the pull-down driver 345 may cause current to flow from the transmission line 335 to the voltage source-VDDQ, which in turn may decrease the voltage on the transmission line 335. The amount of current transferred by the pull-down driver 345 (and thus the voltage reduction on the transmission line 335) may vary with the configurable resistance of the pull-down driver 345. In some examples, the magnitude of +VDDQ is equal to the magnitude of –VDDQ (e.g., the voltage sources may have equal magnitudes and opposite polarities).

Activating (e.g., enabling) a driver may refer to configuring the driver so that a conductive path is established between the transmission line 335 and a voltage source coupled with the driver, whereas deactivating (e.g., disabling) the driver may refer to configuring the driver so that the transmission line 335 is isolated from the voltage source. Activation, deactivation, and configuration of the drivers may be performed or facilitated by control logic such as logic 350 and logic 355, which may be examples of pre-drivers or local controllers. Logic 350 may be configured to control the operation of the pull-up driver 340 and logic 355 may be configured to control the operation of pull-down driver 345. For example, logic 350 may be operable to configure the resistance (and thus the drive-strength) of the pull-up driver 340, as well to activate and deactivate the pull-up driver 340. Similarly, logic 355 may be operable to configure the resistance (and thus the drive-strength) of the pull-down driver 345, as well to activate and deactivate the pull-down driver 345. In general, an increase in drive-strength may be achieved by reducing the configurable resistance of a driver and a decrease in drive-strength may be achieved by increasing the configurable resistance of the driver (however, other techniques are within the scope of the disclosure). Logic 350 and logic 355 may operate the respective drivers based on multi-bit data values that correspond to PAM symbols.

To more fully illustrate the ground termination technique, consider an example in which the transmission line 335 is terminated at 0V (e.g., the threshold voltage $V_{TERM}$ is 0V). For instance, the transmission line 335 may be coupled to a ground reference (GND) or another reference voltage via resistor R. In such a scenario, both drivers may be off in between data symbols, which may conserve power relative to other techniques. To generate V2 on the transmission line 335, the first device 305 may configure the pull-up driver 340 with a first resistance, activate the pull-up driver 340, and deactivate the pull-down driver 345. To generate V3 on the transmission line 335, the first device 305 may configure the pull-up driver 340 with a second resistance lower than the first resistance, activate the pull-up driver 340, and deactivate the pull-down driver 345. To generate V1 on the transmission line 335, the first device 305 may configure the pull-down driver with a first resistance, activate the pull-down driver 345, and deactivate the pull-up driver 340. To generate V0 on the transmission line 335, the first device 305 may configure the pull-down driver with a second resistance lower than the first resistance, activate the pull-down driver 345, and deactivate the pull-up driver 340.

In some examples, V0 may be −0.4 V, V1 may be −0.2 V, $V_{TERM}$ may be 0 V, V2 may be +0.2 V, and V3 may be +0.4V. However, other values are contemplated and within the scope of this disclosure.

In the cross-current technique, the first device 305 may generate PAM voltage levels on the transmission line 335 by activating, for at least some PAM voltages, the pull-up driver 340 and the pull-down driver 345 in parallel (e.g., concurrently, for at least partially overlapping durations). In between symbols, the pull-up driver 340 and the pull-down driver 345 may be operated in equilibrium (e.g., with equal drive strengths) so that the transmission line 335 is held at or around 0V (e.g., $V_{TERM}$=0V). So, in the cross-current technique the transmission line 335 may not be coupled to the ground reference via the resistor.

To transition from $V_{TERM}$ to V2 on the transmission line 335, the first device 305 may 1) operate the pull-up driver 340 at the equilibrium drive strength and deactivate the pull-down driver 345, or 2) increase the drive strength of the pull-up driver 340 (e.g., by lowering the resistance of the pull-up driver 340) and deactivate (or decrease the drive strength of) the pull-down driver 345, or some combination of both. To transition from $V_{TERM}$ to V3 on the transmission line 335, the first device 305 may increase the drive strength of the pull-up driver 340 by a greater amount relative to the V2 case and deactivate the pull-down driver 345 (or reduce the drive strength of the pull-down driver 345 by a greater amount relative to the V2 case).

To transition from $V_{TERM}$ to V1 on the transmission line 335, the first device 305 may 1) operate the pull-down driver 345 at the equilibrium drive strength and deactivate the pull-up driver 340, or 2) increase the drive strength of the pull-down driver 345 (e.g., by lowering the resistance of the pull-down driver 345) and deactivate (or decrease the drive strength of) the pull-down driver 345, or some combination of both. To transition from $V_{TERM}$ to V0 on the transmission line 335, the first device 305 may increase the drive strength of the pull-down driver 345 by a greater amount relative to the V1 case and deactivate the pull-up driver 340 (or reduce the drive strength of the pull-up driver 340 by a greater amount relative to the V1 case).

Compared to other techniques, such as the cross-current technique, the ground reference technique may in some examples consume less power (e.g., because the drivers are off in between PAM symbols). However, the cross-current technique may in some examples provide greater control and granularity compared to other techniques, such as the ground reference technique, which may improve signal integrity.

In some cases, it may be advantageous for the first device 305 to switch between the ground termination technique and the cross-current technique. For example, the first device 305 may operate using the ground termination technique if one or more conditions are present, such as if the first device 305 or the system 300 is below a threshold power level. As another example, the first device 305 may operate using the cross-current technique if one or more conditions are present, such as if the data to be communicated has a threshold reliability level.

The receive circuitry 315-b may operate similarly regardless of the technique used by the first device 305. The receive circuitry 315-b may be configured to translate voltage levels on the transmission line 335 into least significant bits (LSBs) and most significant bit (MSBs) of corresponding PAM symbols. The receive circuitry 315-b may include or be coupled with +VDDQ and −VDDQ.

The receive circuitry 315-b may include receivers 360, which may include a first receiver $Rx_H$, a second receiver $Rx_M$, and a third receiver $Rx_L$. Each receiver may be coupled with the transmission line 335 and a respective voltage reference. For example, receiver $Rx_H$ may be coupled with a voltage reference $V_{REFH}$, which may be between V2 and V3, receiver $Rx_M$ may be coupled with a voltage reference $V_{REFM}$, which may be between V1 and V2, and receiver $Rx_L$ may be coupled with a voltage reference $V_{REFL}$, which may be between V0 and V1. If $V_{TERM}$ is 0V, the voltage reference $V_{REFM}$ may be 0V or almost 0V (e.g., because the symbol levels are centered around 0V). So, in some examples, the receiver $V_{REFM}$ may be coupled with a ground reference that serves as the reference voltage reference for receiver $V_{REFM}$.

Each receiver may compare the voltage of a data symbol (e.g., the voltage on the transmission line 335 during a symbol period) with the reference voltage for that receiver and output a logic value (e.g., a logic 0 or a logic 1) indicative of the comparison result. For example, receiver $Rx_M$ may compare the data symbol voltage to $V_{REFM}$ (e.g., 0V) and output a logic 0 if the voltage level of the data symbol is lower than $V_{REFM}$ and may output a logic 1 if the voltage level of the data symbol is higher than $V_{REFM}$. The logic values output by the receivers 360 may be input into the PAM decoder 365, which may determine the data symbol based on the logic values received from the receivers 360 and generate the least significant bit (LSB) and the most significant bit (MSB) of the data symbol. Thus, the PAM decoder 365 may perform PAM decoding, which may also be referred to as PAM demodulation.

Figure 4:
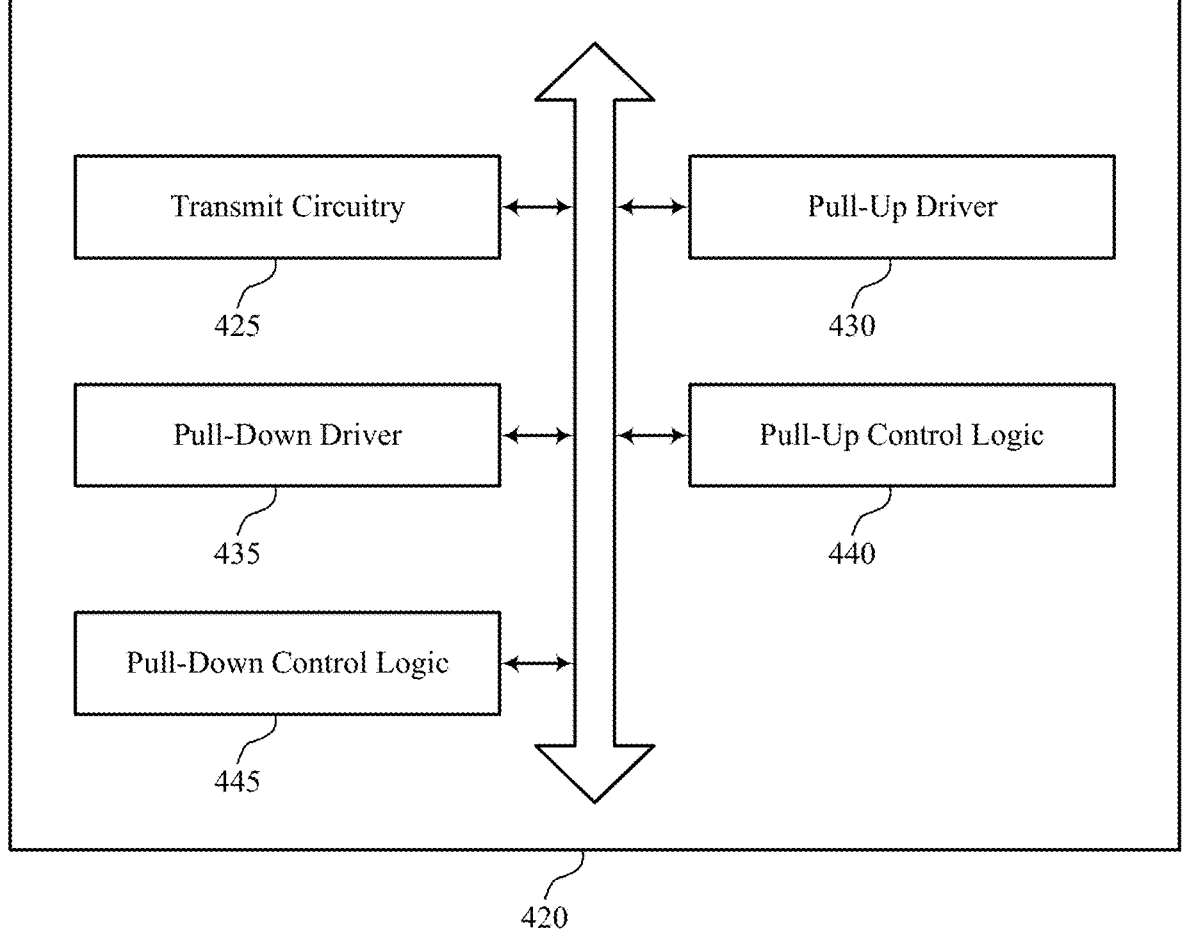
FIG. 4 shows a block diagram of a first device that supports multi-driver signaling in accordance with examples as disclosed herein.

FIG. 4 shows a block diagram 400 of a first device 420 that supports multi-driver signaling in accordance with examples as disclosed herein. The first device 420 may be an example of aspects of a first device as described with reference to FIGS. 1 through 3. The first device 420, or various components thereof, may be an example of means for performing various aspects of multi-driver signaling as described herein. For example, the first device 420 may include a transmit circuitry 425, a pull-up driver 430, a pull-down driver 435, a pull-up control logic 440, a pull-down control logic 445, or any combination thereof. Each of these components may communicate, directly or indirectly, with one another (e.g., via one or more buses).

The transmit circuitry 425 may be configured as or otherwise support a means for receiving a first multi-bit value for transfer to a second device. The pull-up driver 430 may be configured as or otherwise support a means for generating, on a transmission line of a bus using a first driver, a first voltage level of a PAM scheme including three or more voltage levels, where the first voltage level corresponds to the first multi-bit value and is greater than a reference voltage level. In some examples, the transmit circuitry 425 may be configured as or otherwise support a means for receiving a second multi-bit value for transfer to the second device. The pull-down driver 435 may be configured as or otherwise support a means for generating, on the transmission line of the bus using a second driver, a second voltage level of the PAM scheme that corresponds to the second multi-bit value and that is less than the reference voltage level.

In some examples, the pull-up driver 430 may be configured as or otherwise support a means for coupling, using the first driver, the transmission line with a positive voltage source, where the first voltage level is generated based at least in part on the coupling. In some examples, the pull-down driver 435 may be configured as or otherwise support a means for isolating, using the second driver, the transmission line from a negative voltage source during generation of the first voltage level.

In some examples, the pull-down driver 435 may be configured as or otherwise support a means for coupling, using the second driver, the transmission line with a negative voltage source, where the second voltage level is generated based at least in part on the coupling. In some examples, the pull-up driver 430 may be configured as or otherwise support a means for isolating, using the first driver, the transmission line from a positive voltage source during generation of the first voltage level.

In some examples, the pull-up control logic 440 may be configured as or otherwise support a means for configuring a resistance of the first driver based at least in part on the first multi-bit value, where the first voltage level is generated based at least in part on the resistance of the first driver.

In some examples, the transmit circuitry 425 may be configured as or otherwise support a means for receiving a third multi-bit value. In some examples, the pull-up control logic 440 may be configured as or otherwise support a means for modifying the resistance of the first driver based at least in part on the third multi-bit value. In some examples, the pull-up driver 430 may be configured as or otherwise support a means for generating, on the transmission line based at least in part on the modified resistance of the first driver, a third voltage level of the PAM scheme that corresponds to the third multi-bit value and that is greater than the reference voltage level.

In some examples, the pull-down control logic 445 may be configured as or otherwise support a means for configuring a resistance of the second driver based at least in part on the second multi-bit value, where the second voltage level is generated based at least in part on the resistance of the second driver.

In some examples, the transmit circuitry 425 may be configured as or otherwise support a means for receiving a third multi-bit value. In some examples, the pull-down control logic 445 may be configured as or otherwise support a means for modifying the resistance of the second driver based at least in part on the third multi-bit value. In some examples, the pull-down driver 435 may be configured as or otherwise support a means for generating, on the transmission line based at least in part on the modified resistance of the second driver, a third voltage level of the PAM scheme that corresponds to the third multi-bit value and that is less than the reference voltage level. In some examples, the reference voltage level is zero volts.

In some examples, the transmit circuitry 425 may be configured as or otherwise support a means for receiving a multi-bit value corresponding to a voltage level of a PAM scheme that includes three or more voltage levels. In some examples, the pull-up driver 430 may be configured as or otherwise support a means for coupling, using a first driver and based at least in part on the multi-bit value, a transmission line of a bus with a positive voltage source. In some examples, the pull-down driver 435 may be configured as or otherwise support a means for coupling, using a second driver and based at least in part on the multi-bit value, the transmission line of the bus with a negative voltage source. In some examples, the transmit circuitry 425 may be configured as or otherwise support a means for generating the voltage level on the transmission line based at least in part on the coupling the transmission line with the positive voltage source and the negative voltage source.

In some examples, the pull-up control logic 440 may be configured as or otherwise support a means for configuring a resistance of the first driver based at least in part on the multi-bit value. In some examples, the pull-down control logic 445 may be configured as or otherwise support a means for configuring a resistance of the second driver based at least in part on the multi-bit value, where the voltage level is based at least in part on the resistance of the first driver and the resistance of the second driver.

In some examples, the pull-up control logic 440 may be configured as or otherwise support a means for modifying the resistance of the first driver based at least in part on a second multi-bit value corresponding to a second voltage level of the PAM scheme. In some examples, the transmit circuitry 425 may be configured as or otherwise support a means for generating the second voltage level on the transmission line based at least in part on modifying the resistance of the first driver.

In some examples, to support modifying the resistance of the first driver, the pull-up control logic 440 may be configured as or otherwise support a means for decreasing the resistance of the first driver. In some examples, to support modifying the resistance of the first driver, the pull-up control logic 440 may be configured as or otherwise support a means for increasing the resistance of the first driver.

In some examples, the pull-up driver 430 may be configured as or otherwise support a means for transferring, by the first driver, a first amount of current to the transmission line based at least in part on coupling the transmission line with the positive voltage source. In some examples, the pull-down driver 435 may be configured as or otherwise support a means for transferring, by the second driver, a second amount of current from the transmission line based at least in part on coupling the transmission line with the negative voltage source, where the voltage level is generated based at least in part on the first amount of current and the second amount of current.

In some examples, the pull-down control logic 445 may be configured as or otherwise support a means for modifying the resistance of the second driver based at least in part a second multi-bit value corresponding to a second voltage level of the PAM scheme. In some examples, the transmit circuitry 425 may be configured as or otherwise support a means for generating the second voltage level on the transmission line based at least in part on modifying the resistance of the second driver.

In some examples, to support modifying the resistance of the second driver, the pull-down control logic 445 may be configured as or otherwise support a means for increasing the resistance of the second driver. In some examples, to support modifying the resistance of the second driver, the pull-down control logic 445 may be configured as or otherwise support a means for decreasing the resistance of the second driver.

In some examples, the transmit circuitry 425 may be configured as or otherwise support a means for receiving a second multi-bit value corresponding to a second voltage level of the PAM scheme. In some examples, the transmit circuitry 425 may be configured as or otherwise support a means for isolating the transmission line of the bus from the positive voltage source or the negative voltage source based at least in part on the second multi-bit value. In some examples, the transmit circuitry 425 may be configured as or otherwise support a means for generating the second voltage level on the transmission line based at least in part on isolating the transmission line.

FIG. 5 shows a flowchart illustrating a method 500 that supports multi-driver signaling in accordance with examples as disclosed herein. The operations of method 500 may be implemented by a first device or its components as described herein. For example, the operations of method 500 may be performed by a first device as described with reference to FIGS. 1 through 4. In some examples, a first device may execute a set of instructions to control the functional elements of the device to perform the described functions. Additionally or alternatively, the first device may perform aspects of the described functions using special-purpose hardware.

At 505, the method may include receiving a first multi-bit value for transfer (e.g., communication) to a second device. The operations of 505 may be performed in accordance with examples as disclosed herein. In some examples, aspects of the operations of 505 may be performed by a transmit circuitry 425 as described with reference to FIG. 4.

At 510, the method may include generating, on a transmission line of a bus using a first driver, a first voltage level of a PAM scheme including three or more voltage levels, where the first voltage level corresponds to the first multi-bit value and is greater than a reference voltage level. The operations of 510 may be performed in accordance with examples as disclosed herein. In some examples, aspects of the operations of 510 may be performed by a pull-up driver 430 as described with reference to FIG. 4.

At 515, the method may include receiving a second multi-bit value for transfer to the second device. The operations of 515 may be performed in accordance with examples as disclosed herein. In some examples, aspects of the operations of 515 may be performed by a transmit circuitry 425 as described with reference to FIG. 4.

At 520, the method may include generating, on the transmission line of the bus using a second driver, a second voltage level of the PAM scheme that corresponds to the second multi-bit value and that is less than the reference voltage level. The operations of 520 may be performed in accordance with examples as disclosed herein. In some examples, aspects of the operations of 520 may be performed by a pull-down driver 435 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for receiving a first multi-bit value for transfer to a second device, generating, on a transmission line of a bus using a first driver, a first voltage level of PAM scheme including three or more voltage levels, where the first voltage level corresponds to the first multi-bit value and is greater than a reference voltage level, receiving a second multi-bit value for transfer to the second device, and generating, on the transmission line of the bus using a second driver, a second voltage level of the PAM scheme that corresponds to the second multi-bit value and that is less than the reference voltage level.

In some examples of the method 500 and the apparatus described herein, coupling, using the first driver, the transmission line with a positive voltage source, where the first voltage level may be generated based at least in part on the coupling and isolating, using the second driver, the transmission line from a negative voltage source during generation of the first voltage level.

In some examples of the method 500 and the apparatus described herein, coupling, using the second driver, the transmission line with a negative voltage source, where the second voltage level may be generated based at least in part on the coupling and isolating, using the first driver, the transmission line from a positive voltage source during generation of the first voltage level.

Some examples of the method 500 and the apparatus described herein may further include operations, features, circuitry, logic, means, or instructions for configuring a resistance of the first driver based at least in part on the first multi-bit value, where the first voltage level may be generated based at least in part on the resistance of the first driver.

Some examples of the method 500 and the apparatus described herein may further include operations, features, circuitry, logic, means, or instructions for receiving a third multi-bit value, modifying the resistance of the first driver based at least in part on the third multi-bit value, and generating, on the transmission line based at least in part on the modified resistance of the first driver, a third voltage level of the PAM scheme that corresponds to the third multi-bit value and that may be greater than the reference voltage level.

Some examples of the method 500 and the apparatus described herein may further include operations, features, circuitry, logic, means, or instructions for configuring a resistance of the second driver based at least in part on the second multi-bit value, where the second voltage level may be generated based at least in part on the resistance of the second driver.

Some examples of the method 500 and the apparatus described herein may further include operations, features, circuitry, logic, means, or instructions for receiving a third multi-bit value, modifying the resistance of the second driver based at least in part on the third multi-bit value, and generating, on the transmission line based at least in part on the modified resistance of the second driver, a third voltage level of the PAM scheme that corresponds to the third multi-bit value and that may be less than the reference voltage level.

In some examples of the method 500 and the apparatus described herein, the reference voltage level includes zero volts.

FIG. 6 shows a flowchart illustrating a method 600 that supports multi-driver signaling in accordance with examples as disclosed herein. The operations of method 600 may be implemented by a first device or its components as described herein. For example, the operations of method 600 may be performed by a first device as described with reference to FIGS. 1 through 4. In some examples, a first device may execute a set of instructions to control the functional elements of the device to perform the described functions. Additionally or alternatively, the first device may perform aspects of the described functions using special-purpose hardware.

At 605, the method may include receiving a multi-bit value corresponding to a voltage level of a PAM scheme that includes three or more voltage levels. The operations of 605 may be performed in accordance with examples as disclosed herein. In some examples, aspects of the operations of 605 may be performed by a transmit circuitry 425 as described with reference to FIG. 4.

At 610, the method may include coupling, using a first driver and based at least in part on the multi-bit value, a transmission line of a bus with a positive voltage source. The operations of 610 may be performed in accordance with examples as disclosed herein. In some examples, aspects of the operations of 610 may be performed by a pull-up driver 430 as described with reference to FIG. 4.

At 615, the method may include coupling, using a second driver and based at least in part on the multi-bit value, the transmission line of the bus with a negative voltage source. The operations of 615 may be performed in accordance with examples as disclosed herein. In some examples, aspects of the operations of 615 may be performed by a pull-down driver 435 as described with reference to FIG. 4.

At 620, the method may include generating the voltage level on the transmission line based at least in part on the coupling the transmission line with the positive voltage source and the negative voltage source. The operations of 620 may be performed in accordance with examples as disclosed herein. In some examples, aspects of the operations of 620 may be performed by a transmit circuitry 425 as described with reference to FIG. 4.

In some examples, an apparatus as described herein may perform a method or methods, such as the method 600. The apparatus may include, features, circuitry, logic, means, or instructions (e.g., a non-transitory computer-readable medium storing instructions executable by a processor) for receiving a multi-bit value corresponding to a voltage level of a PAM scheme that includes three or more voltage levels, coupling, using a first driver and based at least in part on the multi-bit value, a transmission line of a bus with a positive voltage source, coupling, using a second driver and based at least in part on the multi-bit value, the transmission line of the bus with a negative voltage source, and generating the voltage level on the transmission line based at least in part on the coupling the transmission line with the positive voltage source and the negative voltage source.

Some examples of the method 600 and the apparatus described herein may further include operations, features, circuitry, logic, means, or instructions for configuring a resistance of the first driver based at least in part on the multi-bit value and configuring a resistance of the second driver based at least in part on the multi-bit value, where the voltage level may be based at least in part on the resistance of the first driver and the resistance of the second driver.

Some examples of the method 600 and the apparatus described herein may further include operations, features, circuitry, logic, means, or instructions for modifying the resistance of the first driver based at least in part on a second multi-bit value corresponding to a second voltage level of the PAM scheme and generating the second voltage level on the transmission line based at least in part on modifying the resistance of the first driver.

In some examples of the method 600 and the apparatus described herein, modifying the resistance of the first driver may include operations, features, circuitry, logic, means, or instructions for decreasing the resistance of the first driver.

In some examples of the method 600 and the apparatus described herein, modifying the resistance of the first driver may include operations, features, circuitry, logic, means, or instructions for increasing the resistance of the first driver.

Some examples of the method 600 and the apparatus described herein may further include operations, features, circuitry, logic, means, or instructions for transferring, by the first driver, a first amount of current to the transmission line based at least in part on coupling the transmission line with the positive voltage source and transferring, by the second driver, a second amount of current from the transmission line based at least in part on coupling the transmission line with the negative voltage source, where the voltage level may be generated based at least in part on first amount of current and the second amount of current.

Some examples of the method 600 and the apparatus described herein may further include operations, features, circuitry, logic, means, or instructions for modifying the resistance of the second driver based at least in part a second multi-bit value corresponding to a second voltage level of the PAM scheme and generating the second voltage level on the transmission line based at least in part on modifying the resistance of the second driver.

In some examples of the method 600 and the apparatus described herein, modifying the resistance of the second driver may include operations, features, circuitry, logic, means, or instructions for increasing the resistance of the second driver.

In some examples of the method 600 and the apparatus described herein, modifying the resistance of the second driver may include operations, features, circuitry, logic, means, or instructions for decreasing the resistance of the second driver.

Some examples of the method 600 and the apparatus described herein may further include operations, features, circuitry, logic, means, or instructions for receiving a second multi-bit value corresponding to a second voltage level of the PAM scheme, isolating the transmission line of the bus from the positive voltage source or the negative voltage source based at least in part on the second multi-bit value, and generating the second voltage level on the transmission line based at least in part on isolating the transmission line.

It should be noted that the methods described herein describe possible implementations, and that the operations and the steps may be rearranged or otherwise modified and that other implementations are possible. Further, portions from two or more of the methods may be combined.

An apparatus is described. The apparatus may include a first voltage source configured to supply a positive voltage, a first driver configured to couple a transmission line of a bus with the first voltage source and configured to transfer current to the transmission line based at least in part on a configurable resistance of the first driver, a second voltage source configured to supply a negative voltage, and a second driver configured to couple the transmission line of the bus with the second voltage source, the second driver configured to transfer current from the transmission line of the bus based at least in part on a configurable resistance of the second driver.

In some examples, the apparatus may include logic coupled with the first driver and configured to select the configurable resistance of the first driver based at least in part on a multi-bit value that corresponds to a voltage level of a pulse-amplitude-modulation (PAM) scheme including three or more voltage levels.

In some examples, the apparatus may include logic coupled with the second driver and configured to select the configurable resistance of the second driver based at least in part on the multi-bit value.

In some examples, the apparatus may include a resistor coupled with the transmission line and ground. In some examples, the apparatus may include a first receiver configured to compare a voltage level of the transmission line (or a different transmission line) with a first reference voltage equal to a ground reference. In some examples, the apparatus may include a second receiver configured to compare the voltage level of the transmission line (or the different transmission line) with a second reference voltage greater than the first reference voltage and a third receiver configured to compare the voltage level of the transmission line with a third reference voltage less than the first reference voltage. In some examples of the apparatus, the negative voltage may have a same magnitude as the positive voltage.

Another apparatus is described. The apparatus may include a first receiver (e.g., $Rx_M$) coupled with a transmission line of a bus and configured to compare a voltage level of the transmission line with a first reference voltage equal to a ground reference, a second receiver (e.g., $Rx_H$) coupled with the transmission line of the bus and configured to compare the voltage level of the transmission line with a second reference voltage greater than the first reference voltage, a third receiver (e.g., $Rx_L$) coupled with the transmission line of the bus and configured to compare the voltage level of the transmission line with a third reference voltage less than the first reference voltage, and a decoder configured to determine a pulse-amplitude-modulated (PAM) symbol level based at least in part on comparing the voltage level to the first reference voltage, the second reference voltage, and the third reference voltage.

In some examples of the apparatus, the first receiver may be configured to output a first value that indicates the voltage level may be less than the first reference voltage and a second value that indicates the voltage level may be greater than the first reference voltage. In some examples of the apparatus, the first receiver, the second receiver, and the third receiver may be configured to receive voltage levels below the ground reference and voltage levels above the ground reference.

Another apparatus is described. The apparatus may include a host device including a first driver (e.g., a pull-up driver) configurable to couple a transmission line with a positive voltage source and configurable to transfer current to the transmission line and a second driver (e.g., a pull-down driver) configurable to couple the transmission line with a negative voltage source and configurable to transfer current from the transmission line. The apparatus may also include a memory device including a third driver (e.g., a pull-up driver) configurable to couple the transmission line (or a different transmission line) with the positive voltage source and configurable to transfer current to the transmission line (or the different transmission line) and a fourth driver (e.g., a pull-down driver) configurable to couple the transmission line (or the different transmission line) with the negative voltage source and configurable to transfer current from the transmission line (or the different transmission line). In some examples, the apparatus may include a bus coupled with the host device and the memory device, the bus including the transmission line.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow. The term "coupling" may also refer to the establishment of a conductive path (e.g., by activating one or more switching components) so that a signal (e.g., charge, current, voltage) can be transferred over the conductive path (e.g., between two or more components that were previously isolated).

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A system, comprising:
   a first driver configured to couple a transmission line of a bus with a positive voltage source while in an activated state;
   a second driver configured to couple the transmission line with a negative voltage source while in the activated state; and
   logic coupled with the first driver and the second driver, and configured to cause the system to:
      concurrently activate, during a first duration, the first driver and the second driver to generate a termination voltage at the transmission line; and
      modify, during a second duration that occurs after the first duration, a resistance of one or both of the first driver or the second driver to generate a first voltage on the transmission line indicative of a multi-bit value.

2. The system of claim 1, wherein the logic is further configured to cause the system to:
   operate the system according to a first multi-driver technique, wherein the logic is configured to concurrently activate the first driver and the second driver based at least in part on operating according to the first multi-driver technique; and
   switch from operating according to the first multi-driver technique to operating according to a second multi-driver technique based at least in part on one or more conditions being satisfied.

3. The system of claim 2, wherein, to operate according to the second multi-driver technique, the logic is configured to cause the system to:
   deactivate, during a third duration, the first driver and the second driver to generate the termination voltage at the transmission line, wherein the transmission line is coupled with ground via a resistor; and activate, during a fourth duration, one of the first driver or the second driver to generate a third voltage on the transmission line indicative of a second multi-bit value.

4. The system of claim 2, wherein the logic is further configured to cause the system to:
   determine that the one or more conditions are satisfied based at least in part on determining that a power level associated with the system is below a threshold.

5. The system of claim 1, wherein, to modify the resistance of one or both of the first driver or the second driver, the logic is configured to cause the system to:
   decrease the resistance of the first driver to generate the first voltage at the transmission line, wherein the first voltage is greater than the termination voltage.

6. The system of claim 5, wherein the logic is further configured to cause the system to:
   deactivate, during the second duration, the second driver to generate the first voltage at the transmission line; or
   increase, during the second duration, the resistance of the second driver to generate the first voltage at the transmission line.

7. The system of claim 1, wherein, to modify the resistance of one or both of the first driver or the second driver, the logic is configured to cause the system to:
   decrease the resistance of the second driver to generate the first voltage at the transmission line, wherein the first voltage is less than the termination voltage.

8. The system of claim 7, wherein the logic is further configured to cause the system to:
   deactivate, during the second duration, the first driver to generate the first voltage at the transmission line; or
   increase, during the second duration, the resistance of the first driver to generate the first voltage at the transmission line.

9. The system of claim 1, wherein the resistance of the first driver and the resistance of the second driver are equal during the first duration.

10. A method, comprising:
    generating, during a first duration, a termination voltage on a transmission line of a bus based at least in part on concurrently activating a first driver configured to couple the transmission line with a positive voltage source while in an activated state and a second driver configured to couple the transmission line with a negative voltage source while in the activated state; and
    modifying, during a second duration that occurs after the first duration, a resistance of one or both of the first driver or the second driver to generate a first voltage on the transmission line indicative of a multi-bit value.

11. The method of claim 10, further comprising:
    operating according to a first multi-driver technique, wherein activating the first driver and the second driver is based at least in part on operating according to the first multi-driver technique; and
    switching from operating according to the first multi-driver technique to operating according to a second multi-driver technique based at least in part on one or more conditions being satisfied.

12. The method of claim 11, wherein operating according to the second multi-driver technique comprises:
    deactivating, during a third duration, the first driver and the second driver to generate the termination voltage at the transmission line, wherein the transmission line is coupled with ground via a resistor; and
    activating, during a fourth duration, one of the first driver or the second driver to generate a third voltage on the transmission line indicative of a second multi-bit value.

13. The method of claim 11, further comprising:
determining that the one or more conditions are satisfied based at least in part on determining that a power level is below a threshold.

14. The method of claim 10, wherein modifying the resistance of one or both of the first driver comprises:
decreasing the resistance of the first driver to generate the first voltage at the transmission line, wherein the first voltage is greater than the termination voltage.

15. The method of claim 14, further comprising:
deactivating, during the second duration, the second driver to generate the first voltage at the transmission line; or
increasing, during the second duration, the resistance of the second driver to generate the first voltage at the transmission line.

16. The method of claim 10, wherein modifying the resistance of one or both of the first driver or the second driver comprises:
decreasing the resistance of the second driver to generate the first voltage at the transmission line, wherein the first voltage is less than the termination voltage.

17. The method of claim 16, further comprising:
deactivating, during the second duration, the first driver to generate the first voltage at the transmission line; or
increasing, during the second duration, the resistance of the first driver to generate the first voltage at the transmission line.

18. The method of claim 10, wherein the resistance of the first driver and the resistance of the second driver are equal during the first duration.

19. A non-transitory computer-readable storage medium comprising instructions which, when executed by processing circuitry of a system, cause the system to:
generate, during a first duration, a termination voltage on a transmission line of a bus based at least in part on concurrently activating a first driver configured to couple the transmission line with a positive voltage source while in an activated state and a second driver configured to couple the transmission line with a negative voltage source while in the activated state; and
modify, during a second duration that occurs after the first duration, a resistance of one or both of the first driver or the second driver to generate a first voltage on the transmission line indicative of a multi-bit value.

20. The non-transitory computer-readable storage medium of claim 19, wherein the instructions, when executed by the processing circuitry, further cause the system to:
operate according to a first multi-driver technique, wherein the instructions are executable by the processing circuitry to concurrently activate the first driver and the second driver based at least in part on operating according to the first multi-driver technique; and
switch from operating according to the first multi-driver technique to operating according to a second multi-driver technique based at least in part on one or more conditions being satisfied.

* * * * *